(12) United States Patent
Xu et al.

(10) Patent No.: US 11,762,027 B2
(45) Date of Patent: Sep. 19, 2023

(54) CHARGING CONTROL METHOD AND DEVICE, AND POWER MANAGEMENT CONTROLLER

(71) Applicant: CONTEMPORARY AMPEREX TECHNOLOGY CO., LIMITED, Ningde (CN)

(72) Inventors: Guangyu Xu, Ningde (CN); Shichao Li, Ningde (CN); Wei Zhao, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 113 days.

(21) Appl. No.: 17/563,857

(22) Filed: Dec. 28, 2021

(65) Prior Publication Data
US 2022/0268845 A1 Aug. 25, 2022

Related U.S. Application Data

(63) Continuation of application No. PCT/CN2021/077496, filed on Feb. 23, 2021.

(51) Int. Cl.
*G01R 31/388* (2019.01)
*G01R 31/36* (2020.01)
(Continued)

(52) U.S. Cl.
CPC ....... *G01R 31/388* (2019.01); *G01R 31/3648* (2013.01); *H01M 10/441* (2013.01); *H01M 2010/4271* (2013.01)

(58) Field of Classification Search
CPC .............. G01R 31/388; G01R 31/3648; G01R 31/3835; H01M 10/441;
(Continued)

(56) References Cited

U.S. PATENT DOCUMENTS

| 10,046,652 B2 | 8/2018 | Yoshida et al. |
| 10,338,149 B2 | 7/2019 | Tan et al. |

(Continued)

FOREIGN PATENT DOCUMENTS

| CA | 2201374 A1 * | 10/1995 | .......... H02J 7/00047 |
| CN | 101431250 A * | 5/2009 | ............. G05F 1/565 |

(Continued)

*Primary Examiner* — M Baye Diao
(74) *Attorney, Agent, or Firm* — Scully, Scott, Murphy & Presser, P.C.

(57) ABSTRACT

An embodiment of this application provides a charging control method and device and a power management controller. The charging control method includes: determining whether battery status of a battery pack meets preset conditions, where the battery pack includes a plurality of battery cells, and the preset conditions are: the battery pack has been left standing for a preset duration, and an open-circuit voltage of each battery cell in the battery pack falls within a preset range; and charging the battery pack based on a charging policy corresponding to a determining result, so that a capacity of a battery cell with a highest remaining capacity in the battery pack reaches a nominal capacity of the battery cell with the highest remaining capacity.

11 Claims, 7 Drawing Sheets

(51) Int. Cl.
*H01M 10/44* (2006.01)
*H01M 10/42* (2006.01)

(58) Field of Classification Search
CPC ....... H01M 2010/4271; H01M 10/0525; H02J 7/0048; H02J 7/007186; H02J 7/0013; H02J 7/007182
USPC ........................................................ 320/134
See application file for complete search history.

(56) References Cited

U.S. PATENT DOCUMENTS

| | | | |
|---|---|---|---|
| 11,316,212 B2* | 4/2022 | Tang | G01R 31/3648 |
| 2014/0159664 A1* | 6/2014 | Yoshida | H01M 10/54 |
| | | | 320/116 |
| 2014/0320089 A1* | 10/2014 | Wang | H01M 10/448 |
| | | | 320/157 |
| 2016/0325633 A1 | 11/2016 | Yoshida et al. | |
| 2018/0106866 A1 | 4/2018 | Tan et al. | |
| 2022/0190626 A1* | 6/2022 | Yao | H02J 7/00714 |

FOREIGN PATENT DOCUMENTS

| | | | | | |
|---|---|---|---|---|---|
| CN | 103427459 | A | | 12/2013 | |
| CN | 103616645 | A | | 3/2014 | |
| CN | 105270190 | A | * | 1/2016 | ......... Y02T 10/7072 |
| CN | 103616645 | B | * | 6/2016 | ............ G01R 31/36 |
| CN | 106291390 | A | | 1/2017 | |
| CN | 106463997 | A | * | 2/2017 | ....... H02J 7/007182 |
| CN | 107492917 | A | | 12/2017 | |
| DK | 2800195 | T3 | | 12/2016 | |
| JP | 4068275 | B2 | * | 3/2008 | ............ G06F 1/263 |
| JP | 4346881 | B2 | * | 10/2009 | ............ Y02E 60/10 |
| JP | 2016214058 | A | | 12/2016 | |
| KR | 20130040575 | A | * | 4/2013 | ........... H02J 7/0013 |
| WO | WO-2017133759 | A1 | * | 8/2017 | ......... B60L 11/1861 |
| WO | WO-2018045714 | A1 | * | 3/2018 | ........... H02J 7/0086 |

* cited by examiner

CHARGING CONTROL METHOD AND DEVICE, AND POWER MANAGEMENT CONTROLLER

CROSS-REFERENCE TO RELATED APPLICATIONS

This application is a continuation of International Application No. PCT/CN2021/077496, filed on Feb. 23, 2021, the disclosure of which is hereby incorporated by reference in its entirety.

TECHNICAL FIELD

This application relates to the technical field of lithium-ion batteries, and in particular, to a charging control method and device and a power management controller.

BACKGROUND

Currently, to increase an energy density of a lithium-ion battery in the design of the lithium-ion battery, a weight of coating on a negative electrode of the lithium-ion battery is reduced, that is, an N/P (N/P is a ratio of a capacity per unit area of the negative electrode to a capacity per unit area of a positive electrode) is reduced. However, the reduced N/P deteriorates a service life of the lithium-ion battery. Therefore, how to ensure a high service life of the lithium-ion battery on the basis of reducing the N/P is an urgent problem to be solved currently.

SUMMARY

An objective of the embodiments of this application is to provide a charging control method and device and a power management controller to ensure a high service life of a lithium-ion battery on the basis of reducing an N/P of the lithium-ion battery.

According to a first aspect, this application provides a charging control method. The method includes: determining whether battery status of a battery pack meets preset conditions, where the battery pack includes a plurality of battery cells, and the preset conditions are: the battery pack has been left standing for a preset duration, and an open-circuit voltage of each battery cell in the battery pack falls within a preset range; and charging the battery pack based on a charging policy corresponding to a determining result, so that a capacity of a battery cell with a highest remaining capacity in the battery pack reaches a nominal capacity of the battery cell with the highest remaining capacity.

In the charging control method designed above, the battery pack is charged based on different charging policies selected depending on whether the battery status of the battery pack meets the preset conditions. All the charging policies ensure that the capacity of the battery cell with the highest remaining capacity in the battery pack reaches the corresponding nominal capacity of the battery cell. A capacity difference between the battery cells in the battery pack is not too great. Therefore, after completion of charging, the capacities of all battery cells in the battery pack are close to the nominal capacities of the battery cells respectively. In this way, the lithium-ion battery is basically free from attenuation during charging, and a high service life of the lithium-ion battery is ensured on the basis of reducing an N/P of the lithium-ion battery.

In an optional implementation of the first aspect, the charging the battery pack based on a charging policy corresponding to a determining result includes: obtaining, when the determining result is that the preset conditions are met, a corresponding remaining capacity of each battery cell based on the open-circuit voltage of each battery cell, and obtaining the highest remaining capacity among remaining capacities of the plurality of battery cells; determining a to-be-charged capacity of the battery pack based on the nominal capacity of the battery cell with the highest remaining capacity as well as the highest remaining capacity; and charging the battery pack in an amount of the to-be-charged capacity to complete the charging of the battery pack.

In the implementation designed above, the to-be-charged capacity is calculated based on the nominal capacity of the battery cell with the highest remaining capacity as well as the highest remaining capacity. Therefore, the to-be-charged capacity is used as a charge cut-off condition. After completion of charging, the capacity of the battery cell with the highest remaining capacity can reach the nominal capacity. Because a plurality of battery cells in the battery pack are connected in series, the capacity of each battery cell other than the battery cell with the highest remaining capacity also increases by the same capacity. The capacity difference between the battery cells in the battery pack is not too great. Therefore, after completion of charging, the capacities of all battery cells in the battery pack are close to the nominal capacities of the battery cells respectively. In this way, the lithium-ion battery is basically free from attenuation during charging, and a high service life of the lithium-ion battery is ensured on the basis of reducing the N/P of the lithium-ion battery.

In an optional implementation of the first aspect, the charging the battery pack based on a charging policy corresponding to a determining result includes: obtaining a corresponding full-charge voltage of each battery cell when the determining result is that the preset conditions are not met; and charging the battery pack until a charge voltage of any battery cell reaches the corresponding full-charge voltage.

In an optional implementation of the first aspect, the obtaining a corresponding full-charge voltage of each battery cell includes: obtaining the corresponding full-charge voltage of each battery cell that is determined in a charge cycle in which the preset conditions are previously met.

In the implementation designed above, when the preset conditions are not met, the full-charge voltage that is determined in the charge cycle in which the preset conditions are previously met is used as a charge cut-off condition, so that a cut-off circumstance on this occasion of charging is the same as a cut-off circumstance on a previous occasion of meeting the preset conditions. That is, a capacity rendered by the battery pack after completion of charging this time is the same as a capacity rendered when the preset conditions are previously met. Both make the capacity of each battery cell be close to the nominal capacity of the battery cell after completion of charging. In this way, the lithium-ion battery is basically free from attenuation during charging, and a high service life of the lithium-ion battery is ensured on the basis of reducing the N/P of the lithium-ion battery.

In an optional implementation of the first aspect, the obtaining a corresponding full-charge voltage of each battery cell includes: obtaining a preset corresponding full-charge voltage of each battery cell.

In an optional implementation of the first aspect, after the charging the battery pack in an amount of the to-be-charged capacity to complete the charging of the battery pack, the method further includes: obtaining a charge voltage at which the battery cell with the highest remaining capacity cuts off charging, so as to obtain a full-charge voltage of the battery cell with the highest remaining capacity; obtaining a remaining chargeable capacity by which each of a plurality of remaining battery cells is chargeable when the charging is cut off, where the plurality of remaining battery cells include all battery cells except the battery cell with the highest remaining capacity among the plurality of battery cells; determining a corresponding full-charge voltage of each remaining battery cell based on each remaining chargeable capacity, so as to obtain a corresponding full-charge voltage of each of the plurality of battery cells; and storing the corresponding full-charge voltage of each of the plurality of battery cells.

In an optional implementation of the first aspect, the obtaining a remaining rechargeable capacity by which each of a plurality of remaining battery cells is chargeable when the charging is cut off includes: calculating a first difference between the nominal capacity and the highest remaining capacity; and calculating a second difference between the first difference and the remaining capacity of each of the plurality of remaining battery cells, where the second difference corresponding to each remaining battery cell is a corresponding remaining chargeable capacity of the remaining battery cell.

In an optional implementation of the first aspect, the determining a corresponding full-charge voltage of each remaining battery cell based on each remaining chargeable capacity includes: obtaining a first dynamic voltage value of each remaining battery cell based on a remaining capacity of each remaining battery cell at time of cutting off charging; obtaining a second dynamic voltage value of each remaining battery cell based on each remaining chargeable capacity; and calculating a sum of the first dynamic voltage value and the second dynamic voltage value, where the full-charge voltage of each remaining battery cell is a sum of the corresponding first dynamic voltage value and second dynamic voltage value.

In an optional implementation of the first aspect, the determining whether battery status of a battery pack meets preset conditions includes: determining, when the battery pack enters a charging state, whether the battery status of the battery pack meets the preset conditions.

According to a second aspect, this application provides a charging control device. The device includes: a judgment module, configured to determine whether battery status of a battery pack meets preset conditions, where the battery pack includes a plurality of battery cells, and the preset conditions are: the battery pack has been left standing for a preset duration, and an open-circuit voltage of each battery cell in the battery pack falls within a preset range; and a charging module, configured to charge the battery pack based on a charging policy corresponding to a determining result, so that a capacity of a battery cell with a highest remaining capacity in the battery pack reaches a nominal capacity of the battery cell with the highest remaining capacity.

In the implementation designed above, the battery pack is charged based on different charging policies selected depending on whether the battery status of the battery pack meets the preset conditions, so that all the charging policies ensure that the capacity of the battery cell with the highest remaining capacity in the battery pack reaches the corresponding nominal capacity of the battery cell with the highest remaining capacity. A capacity difference between the battery cells in the battery pack is not too great. Therefore, after completion of charging, the capacities of all battery cells in the battery pack are close to the nominal capacities of the battery cells respectively. In this way, the lithium-ion battery is basically free from attenuation during charging, and a high service life of the lithium-ion battery is ensured on the basis of reducing an N/P of the lithium-ion battery.

In an optional implementation of the second aspect, the charging module is specifically configured to: obtain, when the determining result is that the preset conditions are met, a corresponding remaining capacity of each battery cell based on the open-circuit voltage of each battery cell, and obtain the highest remaining capacity among remaining capacities of the plurality of battery cells; determine a to-be-charged capacity of the battery pack based on the nominal capacity of the battery cell with the highest remaining capacity as well as the highest remaining capacity; and charge the battery pack in an amount of the to-be-charged capacity to complete the charging of the battery pack.

In an optional implementation of the second aspect, the charging module is further specifically configured to: obtain a corresponding full-charge voltage of each battery cell when the determining result is that the preset conditions are not met; and charge the battery pack until a charge voltage of any battery cell reaches the corresponding full-charge voltage.

In an optional implementation of the second aspect, the device further includes an obtaining module, configured to: obtain a charge voltage at which the battery cell with the highest remaining capacity cuts off charging, so as to obtain a full-charge voltage of the battery cell with the highest remaining capacity; and obtain a remaining chargeable capacity by which each of a plurality of remaining battery cells is chargeable when the charging is cut off, where the plurality of remaining battery cells include all battery cells except the battery cell with the highest remaining capacity among the plurality of battery cells. The device further includes a determining module, configured to determine a corresponding full-charge voltage of each remaining battery cell based on each remaining chargeable capacity, so as to obtain a corresponding full-charge voltage of each of the plurality of battery cells. The device further includes a storage module, configured to store the corresponding full-charge voltage of each of the plurality of battery cells.

In an optional implementation of the second aspect, the obtaining module is specifically configured to calculate a first difference between the nominal capacity and the highest remaining capacity; and calculate a second difference between the first difference and the remaining capacity of each of the remaining battery cells, where the second difference corresponding to each remaining battery cell is a corresponding remaining chargeable capacity of the remaining battery cell.

In an optional implementation of the second aspect, the determining module is specifically configured to: obtain a first dynamic voltage value at which each remaining battery cell cuts off charging; obtain a second dynamic voltage value of each remaining battery cell based on each remaining chargeable capacity; and calculate a sum of the first dynamic voltage value and the second dynamic voltage value, where the full-charge voltage of each remaining battery cell is a sum of the corresponding first dynamic voltage value and second dynamic voltage value.

In an optional implementation of the second aspect, the judgment module is specifically configured to determine, when the battery pack enters a charging state, whether the battery status of the battery pack meets the preset conditions.

According to a third aspect, this application provides power management controller. The power management controller includes a chip. An instruction is built in the chip.

When executed by the chip, the instruction performs the charging control method according to any optional implementation described in the first aspect or the second aspect.

According to a fourth aspect, this application provides a storage medium on which a computer program is stored. When executed by a processor, the computer program performs the charging control method according to any optional implementation described in the first aspect or the second aspect.

According to a fifth aspect, this application provides a computer program product. When the computer program product is run on a computer, the computer is caused to perform the charging control method according to any optional implementation described in the first aspect or the second aspect.

BRIEF DESCRIPTION OF DRAWINGS

To describe the technical solutions in the embodiments of this application more clearly, the following outlines the drawings used in the embodiments of this application. Apparently, the drawings outlined below are merely a part of embodiments of this application. A person of ordinary skill in the art may derive other drawings from the outlined drawings without making any creative efforts.

Figure 1:
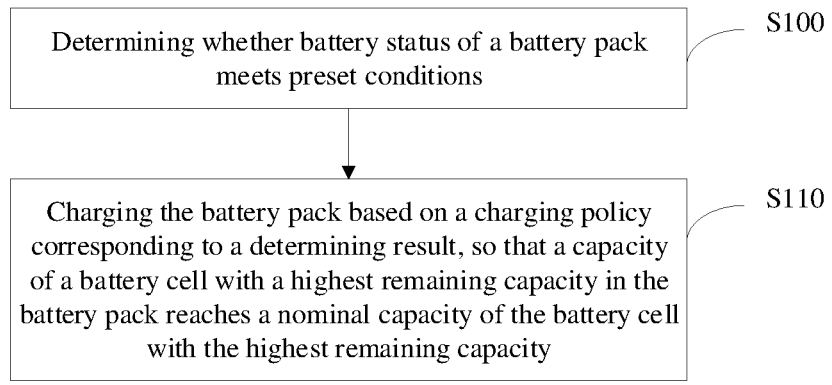
FIG. 1 is a first flowchart of a charging control method according to an embodiment of this application.

Reference numerals: 800—judgment module; 801—charging module; 802—obtaining module; 803—determining module; 804—storage module; 9—chip; 901—processor; 902—memory; 903—communications bus.

DETAILED DESCRIPTION OF EMBODIMENTS

The following gives a more detailed description of implementations of this application with reference to accompanying drawings and embodiments. The detailed description of the following embodiments and the accompanying drawings are intended to exemplarily describe the principles of this application, but not to limit the scope of this application. Therefore, this application is not limited to the described embodiments.

In the description of this application, unless otherwise specified, "a plurality of" means two or more; the terms such as "upper", "lower", "left", "right", "inner", and "outer" indicating a direction or a position relationship are merely intended for ease or brevity of description of this application, but do not indicate or imply that the device or component referred to must be located in the specified direction or constructed or operated in the specified direction. Therefore, such terms shall not be understood as a limitation on this application. In addition, the terms "first", "second", and "third" are merely intended for descriptive purposes, but are not intended to indicate or imply relative importance. "Perpendicular" is not exactly perpendicular, but within an error tolerance range. "Parallel" is not exactly parallel, but within an error tolerance range.

The directional terms appearing in the following description indicate the directions shown in the drawings, but are not intended to limit specific structures in this application. In the context of this application, unless otherwise expressly specified, the terms "mount", "concatenate", and "connect" are understood in a broad sense. For example, a "connection" may be a fixed connection, a detachable connection, or an integrated connection, and may be a direct connection or an indirect connection implemented through an intermediary. A person of ordinary skill in the art can understand the specific meanings of the terms in this application according to specific situations.

An embodiment of this application provides a charging control method. After a lithium-ion battery with a relatively low N/P is charged by using this method, the capacity of the lithium-ion battery can be made close to the nominal capacity, thereby implementing charging that is basically free from attenuation and ensuring a high service life of the lithium-ion battery. N/P is a ratio of a capacity per unit area of a negative electrode to a capacity per a unit area of a positive electrode. The "basically free from attenuation" means that the capacity of the battery is close or equal to its nominal capacity after completion of charging. This method may be performed by a power management controller of a vehicle, or performed by a chip that integrates a power control function. The following description uses a power management controller as an example. As shown in FIG. 1, the method includes the following steps.

Step S100: Determining whether battery status of a battery pack meets preset conditions. In step S100, the battery pack means a lithium-ion battery pack containing a lithium-ion battery cell designed with a relatively low N/P value, and specifically, may be a lithium-ion battery pack with N/P<1. The lithium-ion battery pack contains a plurality of battery cells connected in series.

In step S100, the preset conditions are: the battery pack has been left standing for a preset duration, and an open-circuit voltage of each battery cell in the battery pack falls within a preset range. In a possible implementation, the battery pack having been left standing for a preset duration may be: a sleep time of the battery pack has reached the preset duration. In another possible implementation, the battery pack having been left standing for a preset duration may be: a charge and discharge current of the battery pack has been less than a preset current for the preset duration.

In step S100, the power management controller may collect the open-circuit voltage of each battery cell in the battery pack, a duration for which the charge and discharge current has been less than the preset current, and the like. Subsequently, based on the collected parameters, the power management controller determines whether the battery pack has been left standing for the preset duration, and whether the open-circuit voltage of each battery cell in the battery pack falls within a preset range. Based on this, the power management controller determines whether the battery status meets the preset conditions.

In a possible implementation, the power management controller may perform the determining process when the battery pack enters a charging state. The battery pack entering the charging state may be understood as the battery pack being ready to be charged. For example, the charging state is: the battery pack has been connected to a power supply, but at this time, the power supply has not been connected to the battery pack for charging. In this case, the battery is regarded as having entered the charging state. In such a process, the power management controller can detect whether the battery pack is connected to the power supply, and can control whether to connect the power supply and the battery pack. In another possible implementation, the power management controller may further perform the determining in step S100 during the charging of the battery pack.

Step S110: Charging the battery pack based on a charging policy corresponding to a determining result, so that a capacity of a battery cell with a highest remaining capacity in the battery pack reaches a nominal capacity of the battery cell with the highest remaining capacity.

In step S110, depending on a determining result, the power management controller selects different charging polices to charge the battery pack. The determining result is that the preset conditions are met, or the preset conditions are not met. Different determining results correspond to different charging policies. However, regardless of the charging policy selected, the objective of the solution of this application is to make the capacity of the battery cell with the highest remaining capacity in the battery pack reach a corresponding nominal capacity, and to reduce a capacity difference between the battery cells in the battery pack.

The different charging policies corresponding to different determining results are described in detail below.

Figure 2:
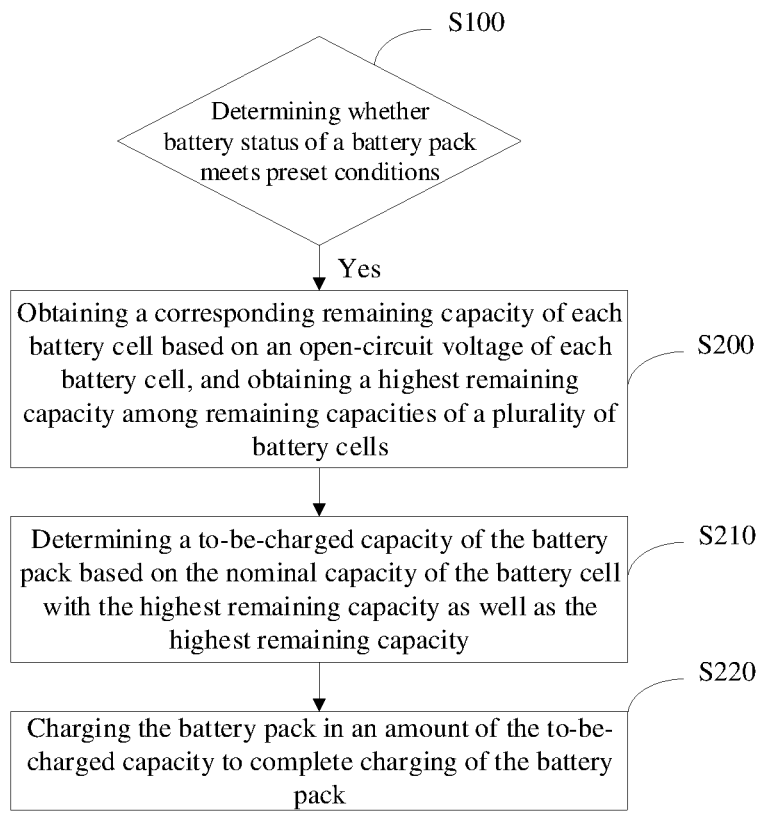
FIG. 2 is a second flowchart of a charging control method according to an embodiment of this application.

In a possible implementation, after the power management controller determines, by performing step S100, that the battery status of the battery pack meets the preset conditions, the power management controller may charge the battery pack based on the charging policy described in the following steps. As shown in FIG. 2, the steps include:

Step S200: Obtaining a corresponding remaining capacity of each battery cell based on the open-circuit voltage of each battery cell, and obtaining the highest remaining capacity among remaining capacities of the plurality of battery cells.

In step S200, referring to the description of step S100, the power management controller may obtain the open-circuit voltage of each battery cell. The power management controller may obtain the corresponding remaining capacity of each battery cell based on the open-circuit voltage of each battery cell.

In a possible implementation, the power management controller may, based on the open-circuit voltage of each battery cell and a curve of a relationship between the open-circuit voltage and the remaining capacity, query the remaining capacity corresponding to each battery cell. The remaining capacity of each battery cell is represented by $[Q_1, Q_2, Q_3, \ldots, Q_n]$. After the corresponding remaining capacity of each battery cell is obtained, a maximum value of all remaining capacities of a plurality of battery cells is determined, so as to obtain the highest remaining capacity $Q_{max}$, where $Q_{max} = \max[Q_1, Q_2, Q_3, \ldots, Q_n]$.

Step S210: Determining a to-be-charged capacity of the battery pack based on the nominal capacity of the battery cell with the highest remaining capacity as well as the highest remaining capacity.

In step S210, the power management controller calculates a to-be-charged capacity $Q_{difference}$ based on the highest remaining capacity $Q_{max}$ obtained in step S200 and the nominal capacity $Q_{cn}$ of the battery cell with the highest remaining capacity. In a possible implementation, the to-be-charge capacity is the nominal capacity minus the highest remaining capacity, that is, $Q_{difference} = Q_{cn} - Q_{max}$.

Step S220: Charging the battery pack in an amount of the to-be-charged capacity to complete the charging of the battery pack.

In a possible implementation, the battery pack may be charged in an amount of the to-be-charged capacity $Q_{difference}$ in step S220 in the following way: converting the to capacity $Q_{difference}$ into a required charge capacity, and charging the battery pack by the required charge capacity so that the battery pack is charged in an amount of the to-be-charged capacity $Q_{difference}$.

In the implementation designed above, the to-be-charged capacity $Q_{difference}$ is obtained by calculation based on the nominal capacity and the highest remaining capacity. Therefore, the to-be-charged capacity $Q_{difference}$ a charge cut-off is used as condition. After completion of charging, the capacity of the battery cell with the highest remaining capacity can reach the nominal capacity. Because a plurality of battery cells in the battery pack are connected in series, the capacity of each battery cell other than the battery cell with the highest remaining capacity also increases by the capacity of $Q_{difference}$. The remaining capacity of other battery cells is lower than that of the battery cell with the highest remaining capacity, and other battery cells may fail to reach their nominal capacities respectively after their capacities increase by $Q_{difference}$. However, the capacity difference between the battery cells in the battery pack is not too great. Therefore, the capacities of all battery cells in the battery pack are close to the nominal capacities of the battery cells respectively after completion of charging. In this way, the lithium-ion battery is basically free from attenuation during charging. The foregoing method is intended for a lithium-ion battery with N/P<1. Therefore, the battery pack is basically free from attenuation and a high service life of the lithium-ion battery is ensured on the basis of reducing the N/P of the lithium-ion battery.

Figure 3:
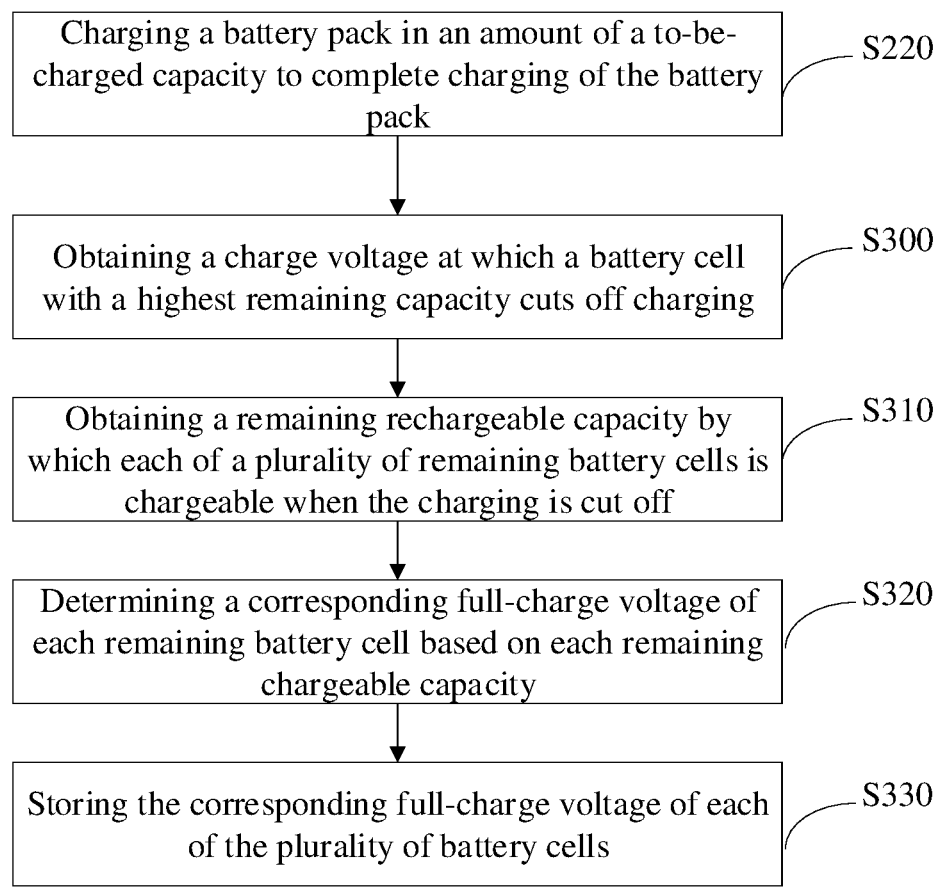
FIG. 3 is a third flowchart of a charging control method according to an embodiment of this application.

Attenuation and self-discharge vary between battery cells. Therefore, when the battery is fully charged, it is not practicable to determine which battery cell will be fully charged first, and it is necessary to calculate a full-charge voltage of each battery cell. The full-charge voltage may serve as a charge cut-off condition in a case that the preset conditions are not met. In a possible implementation, after completing the charging of the battery pack by performing step S220, the power management controller may further perform the following steps to record the full-charge voltage of each battery cell in the case that the charging is completed when the preset conditions are met. As shown in FIG. 3, the steps include:

Step S300: Obtaining a charge voltage at which the battery cell with the highest remaining capacity cuts off charging.

In step S300, the charging is cut off after the battery pack is charged in an amount of the to-be-charged capacity. The power management controller may obtain the charge voltage at which the battery cell with the highest remaining capacity cuts off charging, record the charge voltage at which the battery cell with the highest remaining capacity cuts off charging, and then use the charge voltage as a full-charge voltage of the battery cell with the highest remaining capacity.

Step S310: Obtaining a remaining rechargeable capacity by which each of a plurality of remaining battery cells is chargeable when the charging is cut off.

Figure 4:
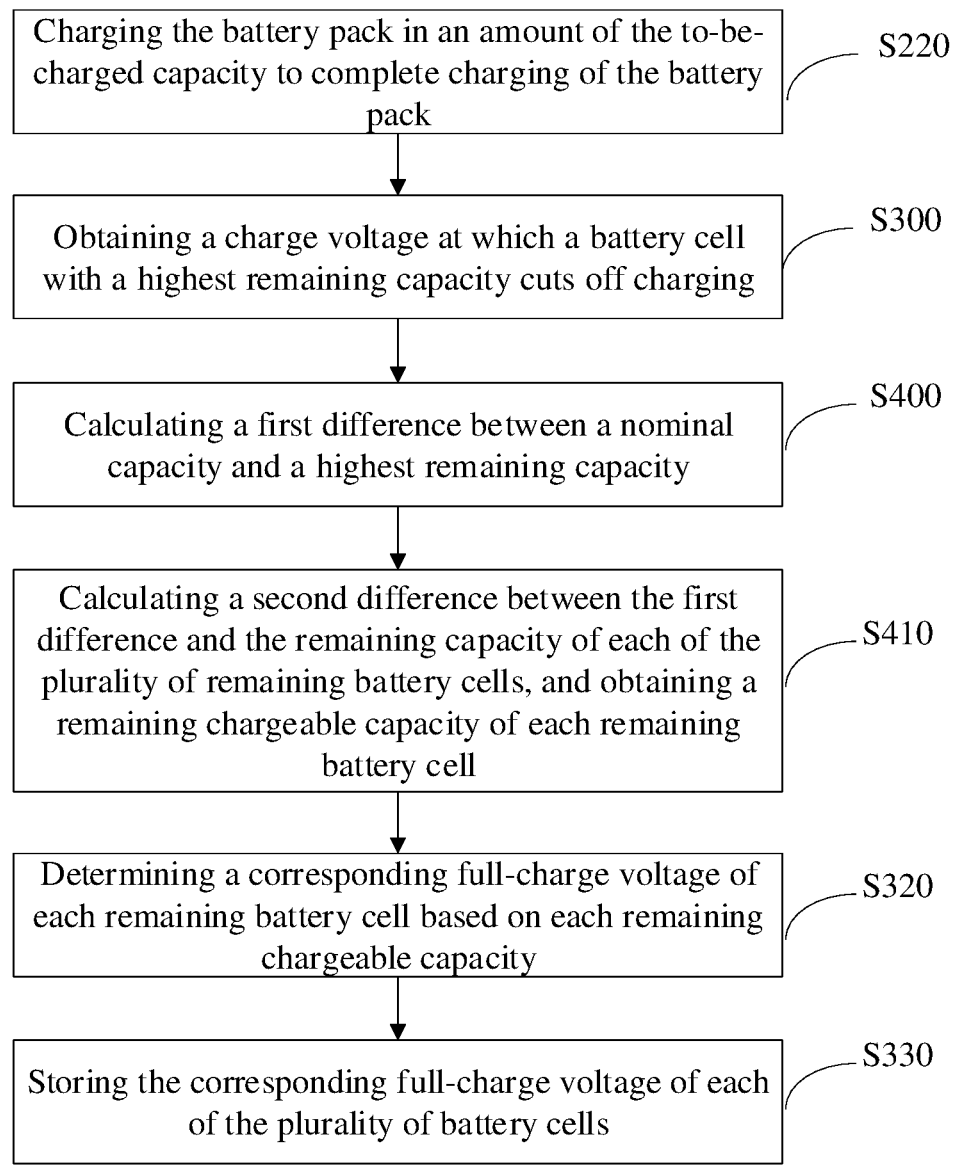
FIG. 4 is a fourth flowchart of a charging control method according to an embodiment of this application.

In step S310, the plurality of remaining battery cells mean all battery cells except the battery cell with the highest remaining capacity among the battery cells in the battery pack. As mentioned above, upon completion of charging, the battery cells except the battery cell with the highest remaining capacity may fail to reach the nominal capacity. Therefore, a remaining chargeable capacity may exist in the plurality of remaining battery cells. When performing step S310, the power management controller may obtain the remaining chargeable capacity by which each remaining battery cell is chargeable when the charging is cut off, and then step S320 is performed. As shown in FIG. 4, a process of calculating the remaining chargeable capacity of each remaining battery cell may include the following steps:

Step S400: Calculating a first difference between the nominal capacity and the highest remaining capacity.

Step S410: Calculating a second difference between the first difference and the remaining capacity of each of the plurality of remaining battery cells, and obtaining a remaining chargeable capacity of each remaining battery cell.

In step S400, the first difference between the nominal capacity and the highest remaining capacity is the capacity difference $Q_{difference}$, that is, $Q_{difference} = Q_{cn} - Q_{max}$.

In step S410, the power management controller determines the corresponding remaining rechargeable capacity by calculating the second difference between the first difference $Q_{difference}$ and the remaining capacity of each remaining battery cell. Specifically, the remaining rechargeable capacity $Q_{remain}[1, 2, 3, \ldots, n]$ of each remaining battery cell may be obtained by using the following formula:

$$Q_{remain}[1,2,3,\ldots,n] = Q_{cn} - Q_{max} - [Q_1, Q_2, Q_3, \ldots, Q_n].$$

Step S320: Determining a corresponding full-charge voltage of each remaining battery cell based on each remaining chargeable capacity.

Figure 5:
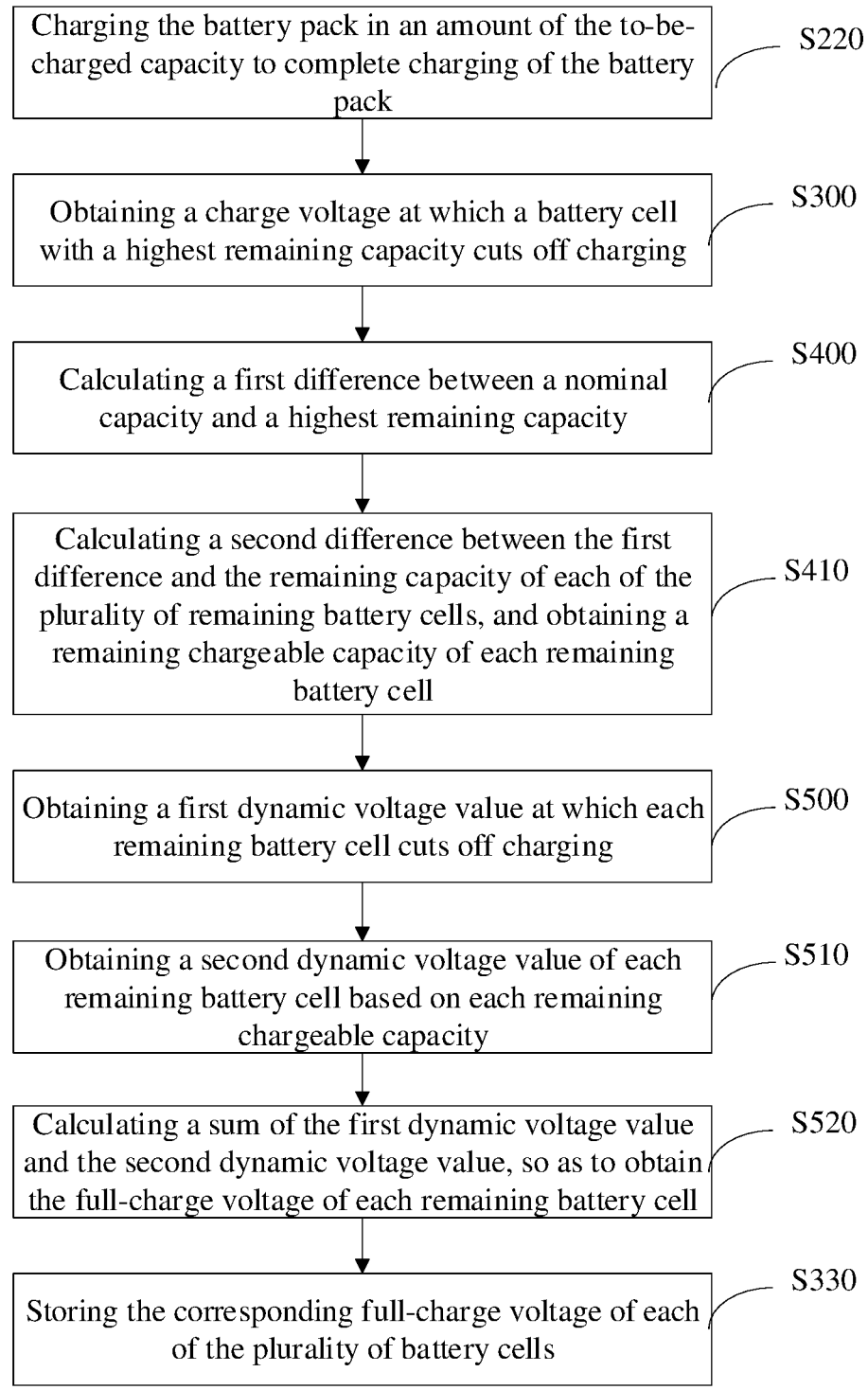
FIG. 5 is a fifth flowchart of a charging control method according to an embodiment of this application.

In step S320, the power management controller may determine the full-charge voltage of each remaining battery cell based on the remaining chargeable capacity of each remaining battery cell. In a possible implementation, as shown in FIG. 5, the full-charge voltage may be determined by performing the following steps:

Step: S500: Obtaining a first dynamic voltage value at which each remaining battery cell cuts off charging.

In a possible implementation, in step S500, when the battery pack cuts off charging, the power management controller may obtain the first dynamic voltage value at which each remaining battery cell cuts off charging. The first dynamic voltage value may be a voltage value at which the remaining battery cell cuts off charging, for example, represented by $V[1,2,3,\ldots,n]$.

Step S510: Obtaining a second dynamic voltage value of each remaining battery cell based on each remaining chargeable capacity.

In a possible implementation, in step S510, the power management controller may determine the corresponding second dynamic voltage value based on the remaining chargeable capacity of each remaining battery cell. In a possible implementation, the power management controller may estimate the second dynamic voltage value of each remaining battery cell based on a dynamic voltage—capacity (OCV_Q) curve rendered when the battery pack cuts off charging (at the end of charging) and based on the remaining chargeable capacity of each remaining battery cell. Assuming that the second dynamic voltage value is represented by $\Delta V$, the second dynamic voltage value of each remaining battery cell is:

$$\Delta V = Q_{remain}[1,2,3,\ldots,n](OCV\_Q).$$

In the formula above, $Q_{remain}[1, 2, 3, \ldots, n]$ (OCV_Q) represents a dynamic voltage value estimated based on the OCV_Q curve at the end of charging and the remaining chargeable capacity of each remaining battery cell.

S520: calculating a sum of the first dynamic voltage value and the second dynamic voltage value, so as to obtain the full-charge voltage of each remaining battery cell. In step S520, the power management controller adds up the first dynamic voltage value and the second dynamic voltage value of each remaining battery cell to obtain the full-charge voltage of each remaining battery cell. Assuming that the full-charge voltage is represented by $V_{fullchrg}$, the full-charge voltage of each remaining battery cell is:

$$V_{fullchrg} = V[1,2,3,\ldots,n] + \Delta V.$$

Step S330: Storing the corresponding full-charge voltage of each of the plurality of battery cells.

In step S330, through steps S300 to S320 above, the full-charge voltage of the battery cell with the highest remaining capacity and the full-charge voltages of the remaining battery cells can be obtained. That is, the full-charge voltage of each battery cell in the battery pack is obtained. Then, the full-charge voltage of each battery cell may be stored.

The foregoing description is intended for a scenario in which the battery status meets the preset conditions, and the following describes a scenario in which the battery status of the battery pack does not meet the preset conditions.

Figure 6:
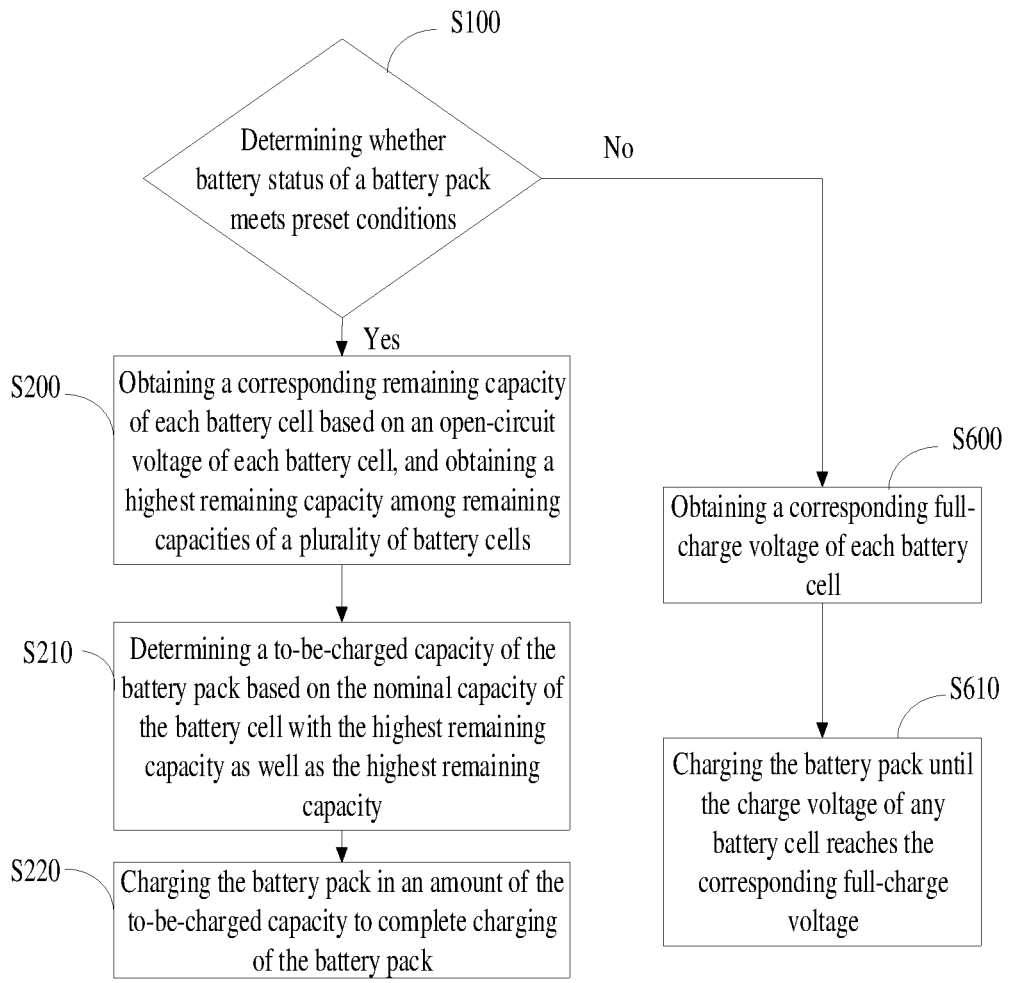
FIG. 6 is a sixth flowchart of a charging control method according to an embodiment of this application.

In a possible implementation, after the power management controller determines, by performing step S100, that the battery status of the battery pack does not meet the preset conditions, the power management controller may charge the battery pack based on the charging policy described in the following steps. As shown in FIG. 6, the steps include:

Step S600: Obtaining a corresponding full-charge voltage of each battery cell.

Figure 7:
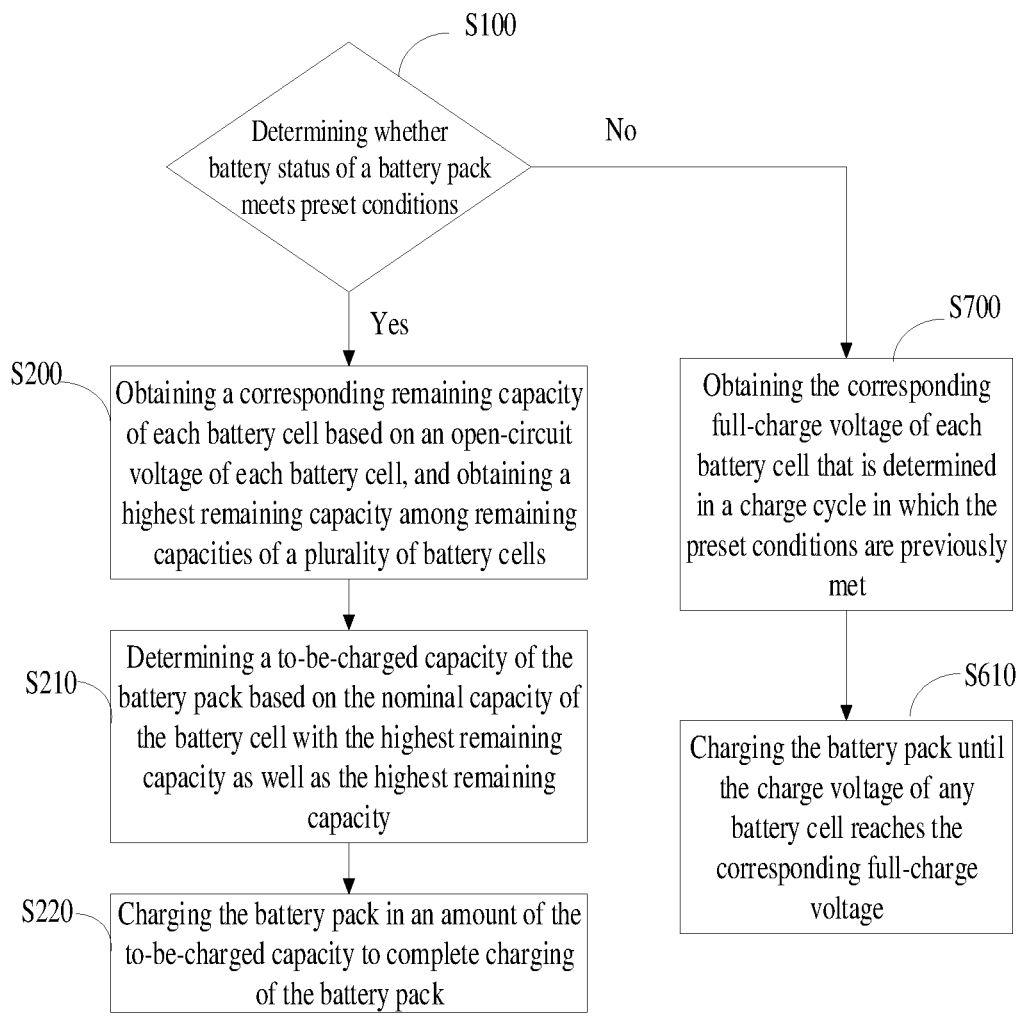
FIG. 7 is a seventh flowchart of a charging control method according to an embodiment of this application.

Step S600 above includes the following two possible implementations:

A first implementation is: after the battery pack has once met the preset conditions in previous charge cycles and has stored the estimated full-charge voltage of each battery cell by performing steps S300 to step S330, as shown in FIG. 7, step S600 may specifically be:

Step S700: Obtaining the corresponding full-charge voltage of each battery cell that is determined in a charge cycle in which the preset conditions are previously met.

In step S700, the obtained full-charge voltage is the full-charge voltage $V_{fullchrg}$ stored in the charge cycle in which the preset conditions are previously met. Therefore, the power management controller uses the corresponding full-charge voltage $V_{fullchrg}$ of each battery cell as a charge cut-off condition when the preset conditions are not met. Therefore, a cut-off circumstance on this occasion of charging is the same as a cut-off circumstance on a previous occasion of meeting the preset conditions. That is, a capacity rendered by the battery pack after completion of charging this time is the same as a capacity rendered when the preset conditions are previously met. Both capacities are close to the nominal capacity. In this way, the lithium-ion battery is basically free from attenuation during charging, and a high service life of the lithium-ion battery is ensured on the basis of reducing the N/P of the lithium-ion battery.

A second implementation is: the preset conditions have never been met in the charging history of the battery pack. For example, when the battery pack has just been manufactured or the time length of static standing has never reached the preset duration, then the battery management controller will not store the estimated full-charge voltage $V_{fullchrg}$ of each battery cell. In this case, the corresponding full-charge voltage of each battery cell obtained in step S600 may be a preset full-charge voltage of each battery cell. For example, at delivery of the battery pack from the manufacturer, an initial full-charge voltage is set for each battery cell in the battery pack. The initial full-charge voltage may be set empirically by the staff. It needs to be noted that after the battery pack meets the preset conditions in a subsequent charge cycle, steps S300 to S330 may be performed to store the estimated full-charge voltage of each battery cell so that the set initial full-charge voltage is updated. The updated full-charge voltage serves as a charge cut-off condition in a next charge cycle in which the preset conditions are not met.

Step S610: Charging the battery pack until the charge voltage of any battery cell reaches the corresponding full-charge voltage.

In the preceding step, when the battery status of the battery pack does not meet the preset conditions, that is, when the time length of static standing does not reach a preset duration and/or the open-circuit voltage of any battery cell is not within a preset range, the power management controller may obtain a corresponding full-charge voltage of each battery cell, and then charge the battery pack until the charge voltage of a battery cell reaches the corresponding full-charge voltage.

Figure 8:
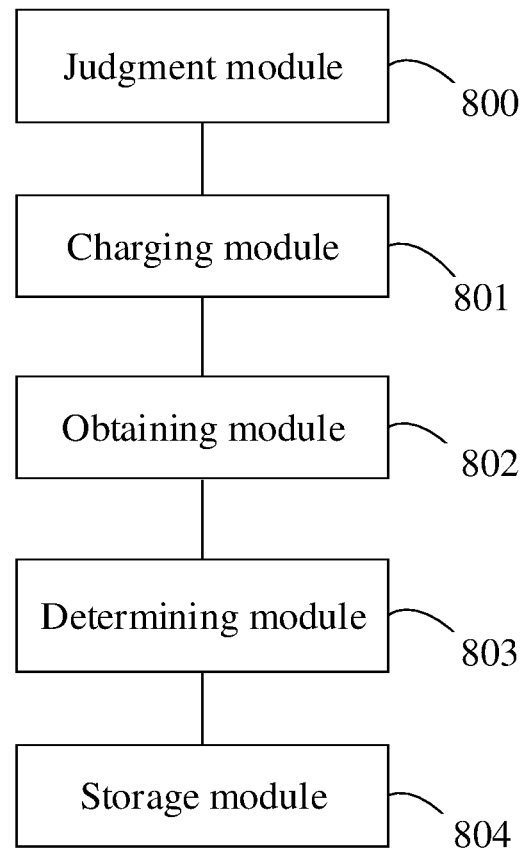
FIG. 8 is a schematic structural diagram of a charging control device according to an embodiment of this application.

FIG. 8 is a schematic structural block diagram of a charging control device according to this application. Understandably, the device corresponds to the method embodiment implemented by the power management controller shown in FIG. 1 to FIG. 7, and can implement the method and related steps performed by the power management controller in the preceding embodiment. The device includes at least one software function module that can be stored in a memory or built in an operating system (OS) of the device in the form of software or firmware. The device includes: a judgment module 800, configured to determine whether battery status of a battery pack meets preset conditions, where the battery pack includes a plurality of battery cells, and the preset conditions are: the battery pack has been left standing for a preset duration, and an open-circuit voltage of each battery cell in the battery pack falls within a preset range; and a charging module 801, configured to charge the battery pack based on a charging policy corresponding to a determining result, so that a capacity of a battery cell with a highest remaining capacity in the battery pack reaches a nominal capacity of the battery cell with the highest remaining capacity.

In the charging control device designed above, the battery pack is charged based on different charging policies selected depending on whether the battery status of the battery pack meets the preset conditions, so that all the charging policies ensure that the capacity of the battery cell with the highest remaining capacity in the battery pack reaches the corresponding nominal capacity. A capacity difference between the battery cells in the battery pack is not too great. Therefore, after completion of charging, the capacities of all battery cells in the battery pack are close to the nominal capacities of the battery cells respectively. In this way, the lithium-ion battery is basically free from attenuation during charging, and a high service life of the lithium-ion battery is ensured on the basis of reducing an N/P of the lithium-ion battery.

In an optional implementation of this embodiment, the charging module 801 is specifically configured to: obtain, when the determining result is that the preset conditions are met, a corresponding remaining capacity of each battery cell based on the open-circuit voltage of each battery cell, and obtain the highest remaining capacity among remaining capacities of the plurality of battery cells; determine a to-be-charged capacity of the battery pack based on the nominal capacity of the battery cell with the highest remaining capacity as well as the highest remaining capacity; and charge the battery pack in an amount of the to-be-charged capacity to complete the charging of the battery pack.

In an optional implementation of this embodiment, the charging module 801 is further specifically configured to: obtain a corresponding full-charge voltage of each battery cell when the determining result is that the preset conditions are not met; and charge the battery pack until a charge voltage of any battery cell reaches the corresponding full-charge voltage.

In an optional implementation of this embodiment, the device further includes an obtaining module 802, configured to: obtain a charge voltage at which the battery cell with the highest remaining capacity cuts off charging, so as to obtain a full-charge voltage of the battery cell with the highest remaining capacity; and obtain a remaining chargeable capacity by which each of a plurality of remaining battery cells is chargeable when the charging is cut off, where the plurality of remaining battery cells include all battery cells except the battery cell with the highest remaining capacity among the plurality of battery cells. The device further includes a determining module 803, configured to determine a corresponding full-charge voltage of each remaining battery cell based on each remaining chargeable capacity, so as to obtain a corresponding full-charge voltage of each of the plurality of battery cells. The device further includes a storage module 804, configured to store the corresponding full-charge voltage of each of the plurality of battery cells.

In an optional implementation of this embodiment, the obtaining module 802 is specifically configured to calculate a first difference between the nominal capacity and the highest remaining capacity; and calculate a second difference between the first difference and the remaining capacity of each of the remaining battery cells, where the second difference corresponding to each remaining battery cell is a corresponding remaining chargeable capacity of the remaining battery cell.

In an optional implementation of this embodiment, the determining module 803 is specifically configured to: obtain a first dynamic voltage value at which each remaining battery cell cuts off charging; obtain a second dynamic voltage value of each remaining battery cell based on each remaining chargeable capacity; and calculate a sum of the first dynamic voltage value and the second dynamic voltage value, where the full-charge voltage of each remaining battery cell is a sum of the corresponding first dynamic voltage value and second dynamic voltage value.

In an optional implementation of this embodiment, the judgment module 800 is specifically configured to determine, when the battery pack enters a charging state, whether the battery status of the battery pack meets the preset conditions.

Figure 9:
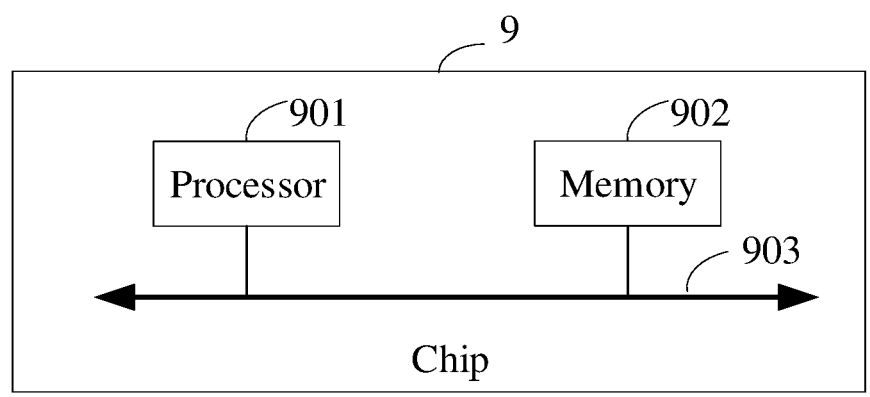
FIG. 9 is a schematic structural diagram of a chip according to an embodiment of this application.

As shown in FIG. 9, this application provides a power management controller. The power management controller includes a chip 9. An instruction is built in the chip 9. When executed by the chip, the instruction performs the charging control method according to the first aspect or any optional implementation of the first aspect. Specifically, the chip 9 includes a processor 901 and a memory 902. The processor 901 is connected to and communicates with the memory 902 by a communications bus 903 and/or other forms of connection mechanisms (not shown). The memory 902 stores a computer program executable by the processor 901. When a computing device runs, the processor 901 executes the computer program to perform the method process according to any of the foregoing implementations, such as steps S100 to S110: determining whether battery status of a battery pack meets preset conditions; and charging the battery pack based on a charging policy corresponding to a determining result, so that a capacity of a battery cell with a highest remaining capacity in the battery pack reaches a nominal capacity of the battery cell with the highest remaining capacity.

This application provides a storage medium. A computer program is stored in the storage medium. When executed by a processor, the computer program performs the steps of the charging control method according to any implementation described above.

The storage medium may be implemented by any type of volatile or non-volatile storage device or a combination thereof, for example, a static random access memory (SRAM), an electrically erasable programmable read-only memory (EEPROM), an erasable programmable read-only memory (EPROM), a programmable read-only memory (PROM), a read-only memory (ROM), a magnetic storage, a flash memory, a magnetic disk, or an optical disk.

This application provides a computer program product. When the computer program product is run on a computer, the computer is caused to perform the charging control method according to any implementation described above.

In the embodiments provided in this application, it is understandable that the disclosed device and method may be implemented by other means. The device embodiment described above is merely exemplary. For example, the unit division is merely division with respect to logical functions, and in actual implementations, the units may be divided in other manners. For another example, a plurality of units or components may be combined or integrated into another system, or some features may be ignored or not implemented. In addition, the displayed or discussed mutual couplings or direct couplings or communications connections may be implemented through some communications interfaces. The indirect couplings or communications connections between the devices or units may be implemented in electronic, mechanical or other forms.

In addition, the units described as discrete components above may be separated physically or not; and the components illustrated as units may be physical units or not, that is, they may be located in one place or distributed on a plurality of network elements. Some or all of the units may be selected according to actual needs to achieve the objectives of the solutions of the embodiments.

In addition, function modules in each embodiment of this application may be integrated together to form a stand-alone part, or each module may exist alone, or two or more modules may be integrated into a stand-alone part.

It needs to be noted that, when the functions are implemented in the form of a software functional module and sold or used as an independent product, the functions may be stored in a computer-readable storage medium. Based on such an understanding, the technical solutions of this application essentially, or the part contributing to the prior art, or some of the technical solutions may be implemented in a form of a software product. The software product is stored in a storage medium, and includes several instructions for instructing a computer device (which may be a personal computer, a server, a network device, or the like) to perform all or some of the steps of the methods described in the embodiments of this application. The storage medium includes any medium that can store program code, for example, a USB flash disk, a removable hard disk, a read-only memory (ROM), a random access memory (RAM), a magnetic disk, or an optical disk.

The relational terms herein such as first and second are used merely to differentiate one entity or operation from another, and do not necessarily require or imply any actual relationship or sequence between the entities or operations.

What is described above is merely embodiments of this application, and is not intended to limit the protection scope of this application. To a person skilled in the art, various modifications and variations may be made to this application. Any modifications, equivalent replacements, improvements, and the like made without departing from the spirit and principles of this application fall within the protection scope of this application.

Although this application has been described with reference to exemplary embodiments, various improvements may be made to the embodiments without departing from the scope of this application, and the parts therein may be replaced with equivalents. Particularly, to the extent that no structural conflict exists, various technical features mentioned in various embodiments can be combined in any manner. This application is not limited to the specific embodiments disclosed herein, but includes all technical solutions falling within the scope of the claims.

What is claimed is:

1. A charging control method, wherein the method comprises:
    determining whether battery status of a battery pack meets preset conditions, wherein the battery pack comprises a plurality of battery cells, and the preset conditions are: the battery pack has been left standing for a preset duration, and an open-circuit voltage of each battery cell in the battery pack falls within a preset range; and
    charging the battery pack based on a charging policy corresponding to a determining result, so that a capacity of a battery cell with a highest remaining capacity in the battery pack reaches a nominal capacity of the battery cell with the highest remaining capacity.

2. The method according to claim 1, wherein the charging the battery pack based on a charging policy corresponding to a determining result comprises:
    obtaining, when the determining result is that the preset conditions are met, a corresponding remaining capacity of each battery cell based on the open-circuit voltage of each battery cell in the battery pack, and obtaining the highest remaining capacity among remaining capacities of the plurality of battery cells;
    determining a to-be-charged capacity of the battery pack based on the nominal capacity of the battery cell with the highest remaining capacity as well as the highest remaining capacity; and
    charging the battery pack in an amount of the to-be-charged capacity to complete the charging of the battery pack.

3. The method according to claim 1, wherein the charging the battery pack based on a charging policy corresponding to a determining result comprises:
    obtaining a corresponding full-charge voltage of each battery cell when the determining result is that the preset conditions are not met; and
    charging the battery pack until a charge voltage of any battery cell reaches the corresponding full-charge voltage.

4. The method according to claim 3, wherein the obtaining a corresponding full-charge voltage of each battery cell comprises:

obtaining the corresponding full-charge voltage of each battery cell that is determined in a charge cycle in which the preset conditions are previously met.

5. The method according to claim 3, wherein the obtaining a corresponding full-charge voltage of each battery cell comprises:
obtaining a preset corresponding full-charge voltage of each battery cell.

6. The method according to claim 2, wherein, after the charging the battery pack in an amount of the to-be-charged capacity to complete the charging of the battery pack, the method further comprises:
obtaining a charge voltage at which the battery cell with the highest remaining capacity cuts off charging, so as to obtain a full-charge voltage of the battery cell with the highest remaining capacity;
obtaining a remaining rechargeable capacity by which each of a plurality of remaining battery cells is chargeable when the charging is cut off, wherein the plurality of remaining battery cells comprise all battery cells except the battery cell with the highest remaining capacity among the plurality of battery cells;
determining a corresponding full-charge voltage of each remaining battery cell based on each remaining chargeable capacity, and obtaining a corresponding full-charge voltage of each of the plurality of battery cells; and
storing the corresponding full-charge voltage of each of the plurality of battery cells.

7. The method according to claim 6, wherein the obtaining a remaining rechargeable capacity by which each of a plurality of remaining battery cells is chargeable when the charging is cut off comprises:
calculating a first difference between the nominal capacity and the highest remaining capacity; and
calculating a second difference between the first difference and the remaining capacity of each of the plurality of remaining battery cells, wherein the second difference corresponding to each remaining battery cell is a corresponding remaining chargeable capacity of the remaining battery cell.

8. The method according to claim 6, wherein the determining a corresponding full-charge voltage of each remaining battery cell based on each remaining chargeable capacity comprises:
obtaining a first dynamic voltage value at which each remaining battery cell cuts off charging;
obtaining a second dynamic voltage value of each remaining battery cell based on each remaining chargeable capacity; and
calculating a sum of the first dynamic voltage value and the second dynamic voltage value, wherein the full-charge voltage of each remaining battery cell is a sum of the corresponding first dynamic voltage value and second dynamic voltage value.

9. The method according to claim 1, wherein the determining whether battery status of a battery pack meets preset conditions comprises:
determining, when the battery pack enters a charging state, whether the battery status of the battery pack meets the preset conditions.

10. A charging control device, wherein the device comprises:
a judgment module, configured to determine whether battery status of a battery pack meets preset conditions, wherein the battery pack comprises a plurality of battery cells, and the preset conditions are: the battery pack has been left standing for a preset duration, and an open-circuit voltage of each battery cell in the battery pack falls within a preset range; and
a charging module, configured to charge the battery pack based on a charging policy corresponding to a determining result, so that a capacity of a battery cell with a highest remaining capacity in the battery pack reaches a nominal capacity of the battery cell with the highest remaining capacity.

11. A power management controller, wherein the power management controller comprises a chip, an instruction is built in the chip, and, when executed by the chip, the instruction performs a charging control method, and the charging control method comprises:
determining whether battery status of a battery pack meets preset conditions, wherein the battery pack comprises a plurality of battery cells, and the preset conditions are: the battery pack has been left standing for a preset duration, and an open-circuit voltage of each battery cell in the battery pack falls within a preset range; and
charging the battery pack based on a charging policy corresponding to a determining result, so that a capacity of a battery cell with a highest remaining capacity in the battery pack reaches a nominal capacity of the battery cell with the highest remaining capacity.

* * * * *